Dec. 16, 1958 D. K. CARDY 2,864,156

METHOD OF FORMING A PRINTED CIRCUIT

Filed April 17, 1953 2 Sheets-Sheet 1

Inventor
Donald K. Cardy
Hill Sherman Meroni Gross & Simpson
by
Attys

Dec. 16, 1958 D. K. CARDY 2,864,156

METHOD OF FORMING A PRINTED CIRCUIT

Filed April 17, 1953 2 Sheets-Sheet 2

Inventor
Donald K. Cardy by Hill Sherman Meroni Gross & Simpson Attys

United States Patent Office 2,864,156

Patented Dec. 16, 1958

2,864,156

METHOD OF FORMING A PRINTED CIRCUIT

Donald K. Cardy, Chicago, Ill.

Application April 17, 1953, Serial No. 349,455

1 Claim. (Cl. 29—155.5)

This invention relates to printed circuits and methods of forming the same and more particularly to printed circuits which are stacked so as to allow crossovers but without any crossover in any one plane.

In the design of printed circuits, great difficulties have heretofore been experienced in attempting to provide crossovers on the surfaces to which the printed circuit is applied. Crossovers have been handled by cementing or spraying a thin layer of insulating material over the lead or conductor to be crossed and then disposing the crossover conductor on top of the insulating material. This method has not been altogether satisfactory and it has heretofore been found desirable to specially design the circuit so that crossovers are avoided. In general, this has necessitated a circuit of much greater area than would be necessary if crossovers were readily handled.

According to this invention, the circuits are printed in any desired conventional manner on sheets of insulating material and the sheets are stacked in superposed relation. The circuits are connected together at desired points by means of conductors extending vertically through the sheets. This overcomes the necessity for having any crossover on any one sheet and also greatly simplifies the design and layout of the circuits. At the same time, the sheets may be readily stacked and connected to provide a mechanically strong structure. Also, since the circuits are distributed over the plurality of superposed sheets, a much more compact arrangement is possible.

According to an important feature of the invention, an opening is provided in a sheet of insulating material and circuit means are provided including at least a pair of electrically conductive elements on opposite sides of the sheet adjacent the opening. The elements are electrically connected by a plug of electrically conductive material disposed in the opening and integrally joined to at least one of the pair of elements.

In accordance with a specific feature of the invention, the plug is formed by a process including flowing a paint or the like of conductive material into the opening. This may be accomplished through a screen process and, if desired, the circuit may be printed on a sheet of insulating material and the plugs provided in the openings in a single operation.

In accordance with another specific feature of the invention, the plug of conductive material preferably projects below the lower surface of the sheet of insulating material so as to be adapted for firm engagement with a conductive element on a next lower sheet.

In accordance with still another feature of the invention, a plurality of sheets may be stacked on a lowermost sheet and may have aligned openings aligned with a conductive element on the lowermost sheet and an integral plug may connect a conductive element on the uppermost sheet with the conductive element on the lowermost sheet.

Still another feature of the invention is in the formation of a bead or head on the lower end of the plug which bead or head projects below the lower surface of the sheet. This head may be formed by providing a member with a recess in the upper surface thereof, disposing the sheet of insulating material on the member with the opening aligned with the recess and then flowing the electrically conductive material into the opening to fill the opening and the recess and thereby form the head portion. This head portion, of course, is adapted for firm engagement with a conductive element on a next lowermost sheet.

A still further feature of the invention is in the provision of a bead or head at the upper end of the plug which projects above the uppermost surface of the sheet of insulating material. This may be formed, in a screen process, by providing an uncoated portion of the screen over the opening and of larger diameter than the opening and then flowing the conductive material through the screen and into the opening to more than fill the opening and provide the head portion at the upper end of the plug.

An object of this invention, accordingly, is to provide an improved stacked printed circuit arrangement.

Another object of the invention is to provide an improved method for forming a printed circuit.

A more specific object of the invention is to provide printed circuits in stacked relation with selected points on the circuit connected by conductors extending vertically between the circuits.

Another object of this invention is to provide an improved method of making a printed circuit in which a circuit is printed on one surface of a sheet and a plug of conductive material formed in the sheet in a single operation.

This invention contemplates other objects, features and advantages which will become more fully apparent from the following detailed description taken in conjunction with the accompanying drawings which illustrate preferred embodiments and in which.

Figures 1, 2, 3:
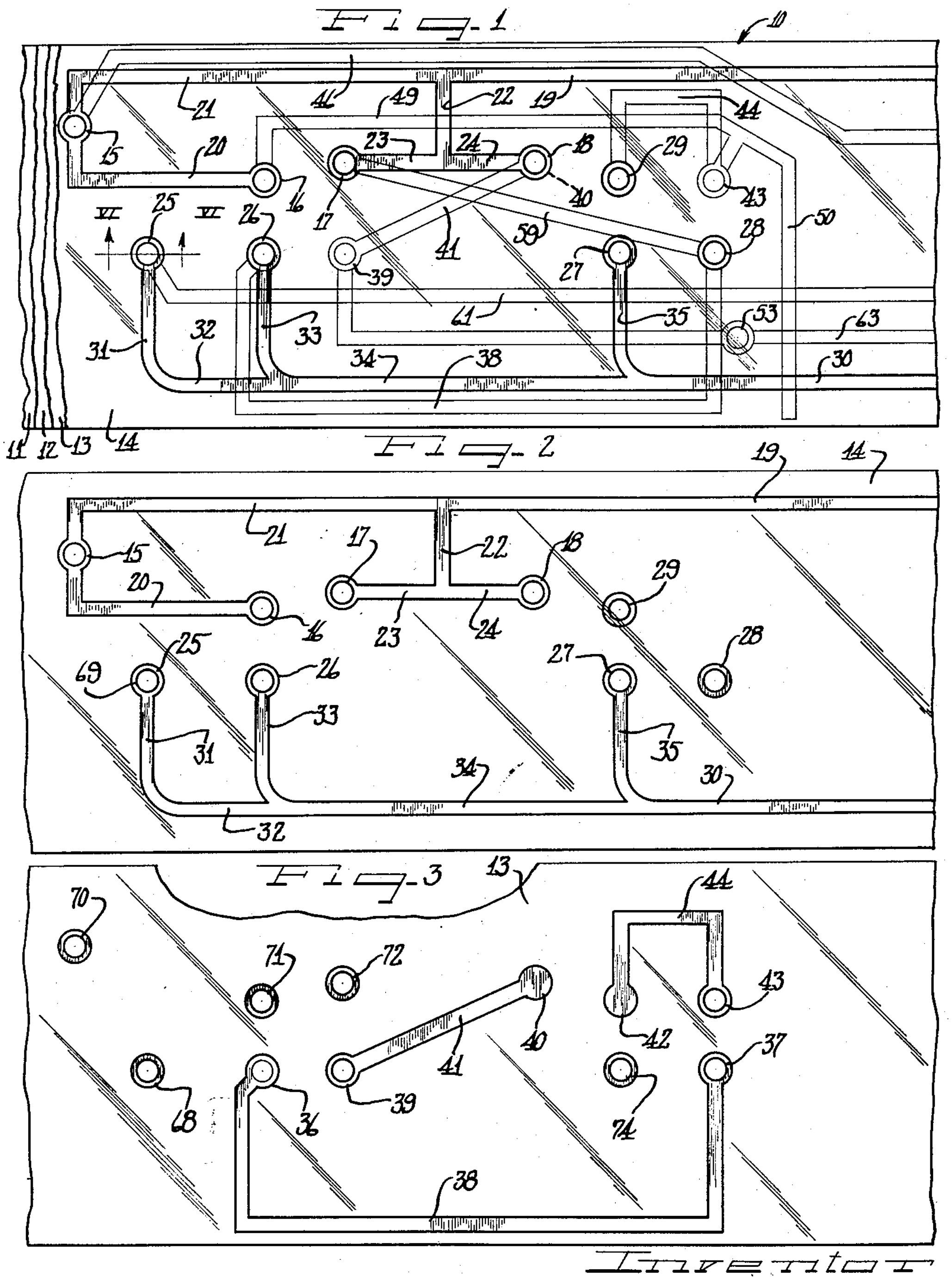
Figure 1 is a top plan view of a printed circuit arrangement embodying the principles of this invention.
Figure 2 illustrates the uppermost sheet of the stacked printed circuit arrangement of Figure 1.
Figure 3 illustrates the printed circuit next below the uppermost circuit of Figure 1.

In Figure 1, reference numeral 10 generally designates a stacked printed circuit arrangement embodying the principles of the present invention. In this arrangement, four sheets of insulating material 11, 12, 13 and 14 are stacked in superposed relation, sheet 11 being the lowermost, sheet 12 being next above sheet 11, sheet 13 being next above sheet 12 and sheet 14 being the uppermost sheet. As illustrated, the sheets 11–14 are of a transparent material but it will be understood that any electrically insulating material is suitable. Each of the sheets 11, 12, 13 and 14 has a circuit printed thereon, certain points of each circuit being arranged for connection to one or more points on the other circuits.

As shown in Figures 1 and 2, the sheet 14 has printed thereon terminal circuit points 15, 16, 17 and 18 which are connected to each other and to a circuit element 19 through circuit elements 20, 21, 22, 23 and 24 and the sheet 14 also has terminal circuit points 25, 26, 27, 28 and 29 with points 25, 26 and 27 connected to each other and to a circuit element 30 through circuit elements 31, 32, 33, 34 and 35. Each of the elements 19–24 and 30–35 may, of course, be a conductor, a resistance, an inductance or a portion of a capacitance and these elements may be formed and applied in any desired manner as by painting, spraying, chemical deposition, vacuum processes, die stamping and dusting, although, as will appear hereinafter, the circuit elements may be preferably formed through a screening process at the same time as inter-connecting plugs are formed, in accordance with a specific feature of this invention.

As shown in Figure 3, the sheet 13 has terminal circuit points 36 and 37 printed thereon with a printed circuit element 38 connecting the terminal points 36 and 37, a pair of printed circuit terminal points 39 and 40 connected by a printed circuit element 41, and a pair of printed circuit terminal points 42 and 43 connected by a printed circuit element 44.

Figure 4:
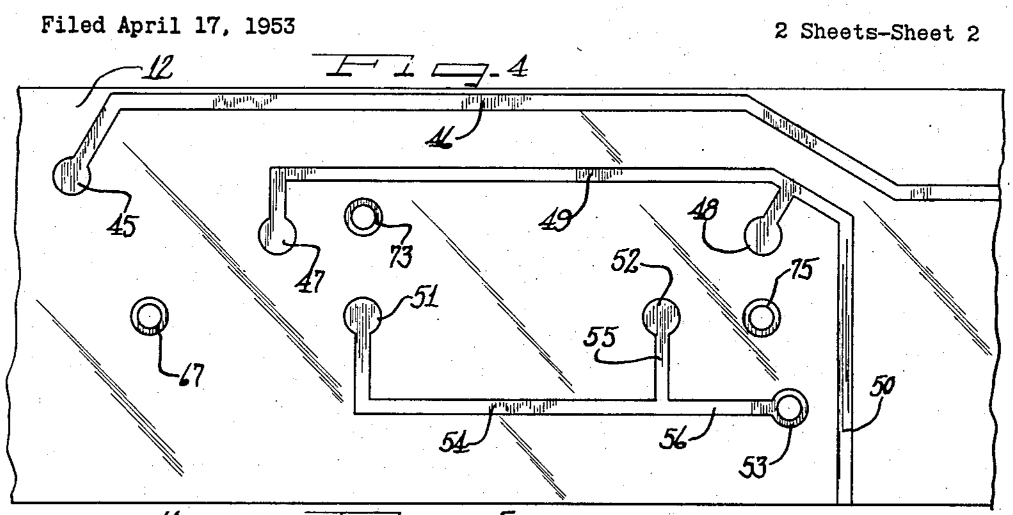
Figure 4 illustrates the printed circuit next above the lowermost circuit of the stacked printed circuit arrangement of Figure 1.

As shown in Figure 4, the sheet 12 has a terminal circuit point 45 connected to a circuit element 46, a pair of terminal points 47 and 48 connected together through a circuit element 49 with the terminal point 48 also connected to a circuit element 50, and circuit terminal points 51, 52 and 53 connected to each other through printed circuit elements 54, 55 and 56.

Figure 5:
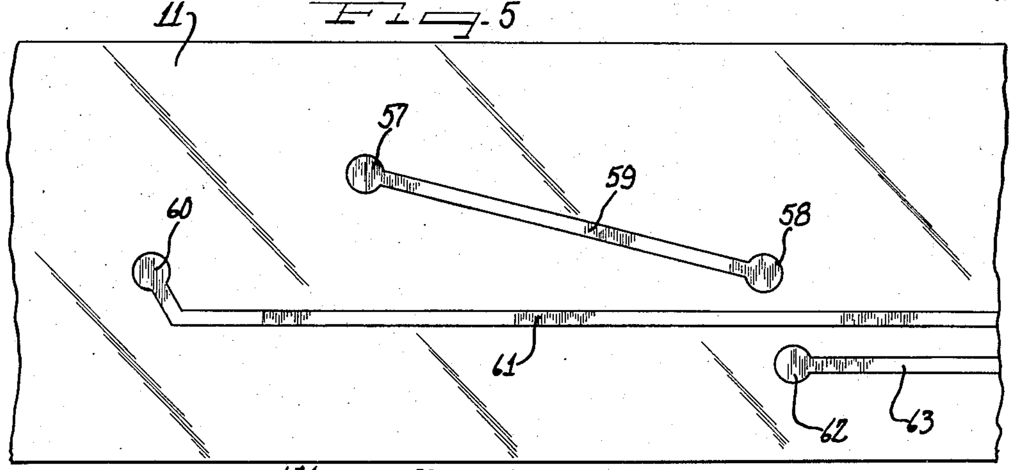
Figure 5 illustrates the lowermost printed circuit of the stacked printed circuit arrangement of Figure 1.

As shown in Figure 5, the sheet 11 has a pair of terminal points 57 and 58 connected together through a circuit element 59, a terminal point 60 connected to a circuit element 61 and a terminal point 62 connected to a circuit element 63.

Figures 6, 7, 8, 9, 10:
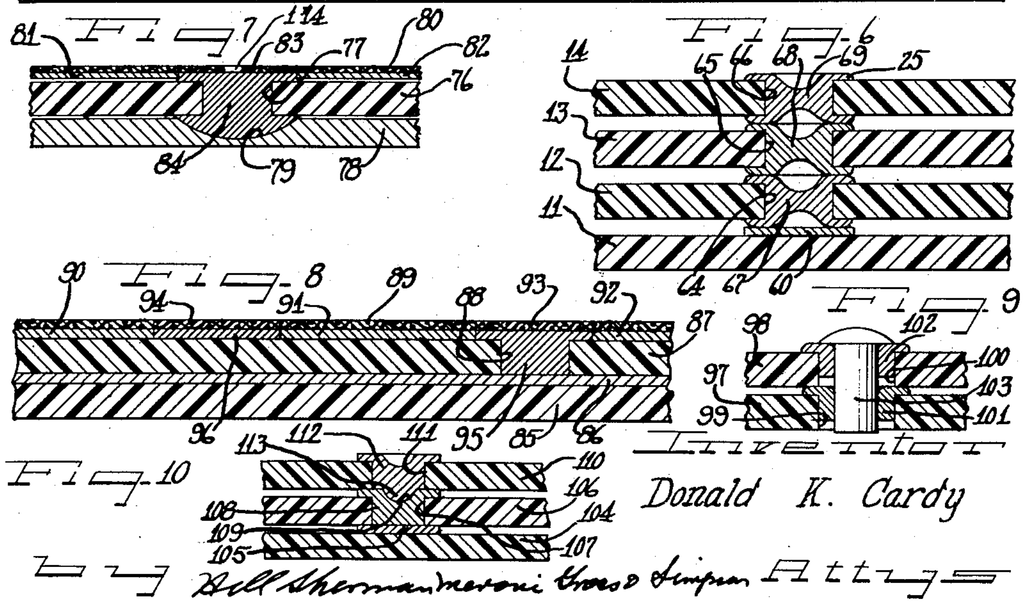
Figure 6 is a sectional view, on an enlarged scale, taken substantially along lines VI—VI of Figure 1.
Figure 7 is a view illustrating one preferred manner of forming an inner connecting plug.
Figure 8 is a sectional view illustrating another preferred manner of forming an inner connecting plug.
Figure 9 is a sectional view illustrating still another preferred manner of executing the invention.
Figure 10 is a sectional view illustrating a still further preferred manner of executing the invention.

According to this invention, selected aligned terminal points on the sheets 11, 12, 13 and 14 are connected through conductors extending through the sheets. For example, the point 25 of the circuit printed on the uppermost sheet 14 is connected to the point 60 of the circuit printed on the lowermost sheet 11. For this purpose, the sheets 12, 13 and 14 have aligned openings 64, 65 and 66, as illustrated in Figure 6, with plugs 67, 68 and 69 disposed in the openings 64, 65 and 66, respectively, to thereby connect the point 25 with the point 60. These plugs may be integral, if desired, or separate as illustrated. If separate, each of the plugs 67, 68 and 69 should project both above and below the respective sheets 12, 13 or 14 so as to insure positive firm inter-engagement therebetween and circuit continuity. In accordance with a specific feature of the invention, the plug 69 is integral with the circuit element 31 and may preferably be formed at the same time as the circuit element 31 is printed, as will be pointed out hereinafter.

Openings and plugs similar to the openings 64, 65 and 66 and plugs 67, 68 and 69 are provided for connecting other aligned circuit points on the sheets 11–14. In particular, a plug is formed at point 15 on the sheet 14 and is connected to the point 45 on the sheet 12 through a plug 70 on the sheet 13; a plug is formed at the point 16 on the sheet 14 and is connected to the point 47 on the sheet 12 through a plug 71 on the sheet 13; a plug is formed at the point 17 on sheet 14 and is connected to point 57 on the sheet 11 through plugs 72 and 73 on the sheets 13 and 12, respectively; a plug is formed at the point 18 on sheet 14 for connection to the point 40 on the sheet 13; a plug is formed at point 29 on sheet 14 for connection to point 42 on sheet 13; a plug is formed at point 26 on sheet 14 for connection to point 36 on sheet 13; a plug is formed at point 27 on the sheet 14 for connection to point 52 on sheet 12 through a plug 74 on sheet 13; a plug is formed at point 28 for connection to a plug formed at point 37 on sheet 13 which is also arranged for connection to point 58 on sheet 11 through a plug 75 on sheet 12; a plug is formed at point 39 on sheet 13 for connection to point 51 on sheet 12; a plug is formed at point 43 on sheet 13 for connection to point 48 on sheet 12; and a plug is formed at point 53 on sheet 12 for connection to point 62 on sheet 11.

It will be noted that a very complex circuit can be provided in compact form on the superposed sheets without any crossovers on any one sheet.

Figure 7 illustrates one preferred manner of forming the plugs in accordance with a highly important feature of the present invention. According to this feature, an insulating plate 76 having an opening 77 therethrough is disposed against a backing plate member 78 having a recess 79 therein with the opening 77 aligned with the recess 79. A screen 80, such as a fine mesh silk screen, is disposed over the insulating plate 76, the screen 80 having coated portions 81 and 82 and an uncoated portion 83 which is disposed over the opening 77. A conductive paint is then applied to the upper surface of the screen 80 and it flows through the uncoated portion 83 of the screen 80 to fill the opening 77 and recess 79 and form a plug 84. The paint is then allowed to dry and if it is of a material that contracts appreciably while drying, the plug 84 will contract into a shape similar to the plugs 67–69 as illustrated in Figure 6, at least at its upper end.

It will be noted that the recess 79 has a diameter larger than that of the opening 77 and the uncoated portion 83 of the screen 80 likewise has a diameter larger than that of the opening 77 so that a rivet head effect is obtained at both the upper and lower ends of the plug 84. It will be apparent, and it is an important feature of this invention, that the screen 80 may have other uncoated portions representing a desired circuit arrangement and the circuit may thus be printed and the plug 84 formed in a single operation.

Figure 8 illustrates another preferred manner of forming plugs in accordance with a further specific feature of the invention. According to this feature, a first plate 85 of insulating material has disposed thereon a circuit element 86 of conductive material and a second plate 87 of insulating material is disposed over the plate 85 and has an opening 88 over the circuit element 86. A screen 89, such as a fine mesh silk screen, is then disposed over the insulating plate 87, the screen 89 having coated portions 90, 91 and 92, and uncoated portion 93 over the opening 88 and, if desired, at least one other uncoated portion 94. A paint of conductive material is applied to the screen 89 and will flow through the uncoated portion 93 of the screen to fill the opening 88 and form a plug 95 in conductive engagement with the circuit element 86. The conductive paint may also flow through the uncoated portion 94 of the screen to form an additional circuit element 96.

Preferably the conductive paint has adhesive properties so as to form a binding engagement between the plug 95 and the circuit element 86 and thus insure circuit continuity as well as hold the plates 85 and 87 together. It will be appreciated that this same process may be used to form integral conductive plugs through any desired number of insulating plates.

Figure 9 illustrates another preferred manner of interconnecting aligned printed circuit points on separate insulated plates. In this species, a pair of superposed plates 97 and 98 have aligned openings 99 and 100 therethrough. A conductive paint is applied to the upper surfaces of the plates 97 and 98 at the openings 99 and 100 to form annular rings 101 and 102 in the openings 99 and 100. A pin 103 is then driven through the rings 101 and 102 to connect the same together. It will be apparent that any desired number of plates can be connected in this manner.

Figure 10 illustrates another important feature of the invention. Referring thereto, a sheet 104 of insulating material has a conductive element 105 applied thereto in any desired manner, as by a screening process. A sheet 106 is then superposed over the sheet 104 with an opening 107 therein aligned with the element 105. Conductive paint or the like is then flowed into the opening 107, preferably by a screening process, to form a plug 108. As the paint dries, it will contract to form a recess 109 in the upper surface of the plug 108, but the lower surface of the plug 108 is in sealing engagement with the element 105 and cannot contract away therefrom.

A third sheet 110 of insulating material is then superposed over the sheet 106 with an opening 111 therein aligned with the opening 107. Conductive paint is then flowed into the opening 111 to form a plug 112 which will have a depending projection 113 interfitted with the recess 109 to lock the sheets 106 and 110 against lateral displacement. This procedure may, of course, be followed in connecting any desired number of superposed circuits.

If desired, the plug on each sheet may be formed before the plug on the next lowermost sheet is dry so as to be integral therewith. That is, the plug 112 may be formed before the plug 108 is dry and the plug 108 might be formed before the element 105 is dry.

In accordance with a still further feature of the invention, the screen used in forming the plugs may be provided with enlarged openings to facilitate flow of the paint into the openings in the insulating sheets. For example, the screen 80 in Figure 7 may have an opening 114 in the center of the uncoated portion 83 thereof. This opening 114 is, of course, much larger than the openings defined by the fibers or wires of the screen 80 and paint may thus flow much more freely into the opening 77 to form the plug 84. Preferably, the opening 114 should be large enough so that the opening 77 in the insulating sheet 76 will be completely filled when the paint is applied with the optimum force and pressure required to form the circuit elements on the upper surface of the sheet 76.

It will be understood that modifications and variations may be effected without departing from the spirit and scope of the novel concepts of the present invention.

I claim as my invention:

In a method of forming a printed circuit, the steps of disposing over a first sheet of insulating material a first screen having coated and uncoated portions, the uncoated portions representing a desired circuit arrangement; applying a conductive paint to said screen to form conductive elements on said first sheet; removing said first screen; disposing over said first sheet of insulating material a second sheet of insulating material having openings aligned with portions of the conductive elements formed on said first sheet; disposing over said second sheet of insulating material a second screen having coated and coacted portions; parts of the uncoated portions being aligned with said openings; applying conductive paint to said second screen to form conductive elements on said second sheet and to cause the paint to flow through said recesses into engagement with portions of the conductive paint applied to said first sheet; removing said second screen; and allowing said paint to dry while holding said sheets together.

References Cited in the file of this patent

UNITED STATES PATENTS

| | | |
|---|---|---|
| 1,563,731 | Ducas | Dec. 1, 1925 |
| 1,755,934 | Reyner | Apr. 22, 1930 |
| 2,270,166 | Hiensch et al. | Jan. 13, 1942 |
| 2,441,960 | Eisler | May 25, 1948 |
| 2,474,988 | Sargrove | July 5, 1949 |
| 2,492,236 | Mydlil | Dec. 27, 1949 |
| 2,502,291 | Taylor | Mar. 28, 1950 |
| 2,512,162 | Lips | June 20, 1950 |
| 2,611,040 | Brunetti | Sept. 16, 1952 |
| 2,616,994 | Luhn | Nov. 4, 1952 |
| 2,703,377 | Hings et al. | Mar. 1, 1955 |

FOREIGN PATENTS

| | | |
|---|---|---|
| 19,919 | Great Britain | 1892 |
| 515,354 | Great Britain | Dec. 4, 1939 |

OTHER REFERENCES

Printed Circuit Techniques, National Bureau of Standards, Circular 468, pages 10—13.